(12) United States Patent
Cardoso

(10) Patent No.: US 8,073,996 B2
(45) Date of Patent: Dec. 6, 2011

(54) PROGRAMMABLE MODULAR CIRCUIT FOR TESTING AND CONTROLLING A SYSTEM-ON-A-CHIP INTEGRATED CIRCUIT, AND APPLICATIONS THEREOF

(75) Inventor: Paulo António Ribeiro Cardoso, Porto Salvo (PT)

(73) Assignee: Synopsys, Inc., Mountain View, CA (US)

( * ) Notice: Subject to any disclaimer, the term of this patent is extended or adjusted under 35 U.S.C. 154(b) by 201 days.

(21) Appl. No.: 11/971,611

(22) Filed: Jan. 9, 2008

(65) Prior Publication Data
US 2009/0177814 A1      Jul. 9, 2009

(51) Int. Cl.
    *G06F 13/12*      (2006.01)
(52) U.S. Cl. .................................................. 710/62
(58) Field of Classification Search .................. 710/62
    See application file for complete search history.

(56) References Cited

U.S. PATENT DOCUMENTS

| | | | | |
|---|---|---|---|---|
| 4,703,484 A | * | 10/1987 | Rolfe et al. | 714/726 |
| 5,130,988 A | * | 7/1992 | Wilcox et al. | 714/727 |
| 5,392,296 A | * | 2/1995 | Suzuki | 714/731 |
| 5,473,617 A | * | 12/1995 | Farwell | 714/727 |
| 5,498,972 A | * | 3/1996 | Haulin | 324/765 |
| 5,568,492 A | * | 10/1996 | Flint et al. | 714/724 |
| 5,933,374 A | * | 8/1999 | Weinfurtner | 365/189.09 |
| 6,032,278 A | * | 2/2000 | Parvathala et al. | 714/726 |
| 6,226,780 B1 | * | 5/2001 | Bahra et al. | 716/18 |
| 6,314,539 B1 | * | 11/2001 | Jacobson et al. | 714/727 |
| 6,476,630 B1 | * | 11/2002 | Whitten et al. | 324/765 |
| 6,813,738 B2 | * | 11/2004 | Whetsel, Jr. | 714/727 |
| 6,870,375 B2 | * | 3/2005 | Sarma et al. | 324/658 |
| 6,975,980 B2 | * | 12/2005 | Whetsel | 703/25 |
| 2004/0002832 A1 | * | 1/2004 | Chan | 702/120 |
| 2004/0015758 A1 | * | 1/2004 | Pathak et al. | 714/725 |
| 2007/0109882 A1 | * | 5/2007 | Taniguchi et al. | 365/200 |

\* cited by examiner

*Primary Examiner* — Henry Tsai
*Assistant Examiner* — Eric Oberly
(74) *Attorney, Agent, or Firm* — Bever, Hoffman & Harms, LLP; Jeanette S. Harms

(57) ABSTRACT

The present invention provides a programmable modular circuit for testing and controlling a system-on-a-chip integrated circuit, and applications thereof. In an embodiment, the programmable modular circuit comprises a plurality of serial-to-parallel interface registers coupled together by a data line, a clock line, and an enable line. Each of the plurality of serial-to-parallel interface registers is coupled to a module of the system-on-a-chip. The data line and the clock line are used to serially clock data into the plurality of serial-to-parallel interface registers. Applying a first logical value to the enable line provides the data serially clocked into the plurality of serial-to-parallel interface registers to modules of the system-on-a-chip. Applying a second logical value to the enable line provides default values to modules of the system-on-a-chip. The data values serially clocked into the plurality of serial-to-parallel interface registers can be used to test and/or to modify selected operating characteristics of the system-on-a-chip.

16 Claims, 8 Drawing Sheets

PROGRAMMABLE MODULAR CIRCUIT FOR TESTING AND CONTROLLING A SYSTEM-ON-A-CHIP INTEGRATED CIRCUIT, AND APPLICATIONS THEREOF

FIELD OF THE INVENTION

The present invention generally relates to electronics. More particularly, it relates to a programmable modular circuit for testing and controlling a system-on-a-chip integrated circuit, and applications thereof.

BACKGROUND OF THE INVENTION

The trend in electronic design is to integrate as many circuits of an electronic system or device as possible in a single integrated circuit know as a system-on-a-chip (SoC). An SoC may contain digital, analog, mixed-signal, and radio-frequency functions. SoC designs are typically preferred over multi-chip designs, for example, because SoC designs usually consume less power and have a lower cost and higher reliability than multi-chip designs.

One drawback of convention SoC designs, however, is that there is limited assess after fabrication to the multiple circuits that make up the SoC. Thus, it can be difficult, if not impossible, to test each of the multiple circuits that makeup the SoC and/or to change the operating characteristics of the multiple circuits that makeup the SoC. Accordingly, new systems, methods and techniques are needed that overcome this limitation.

SUMMARY OF THE INVENTION

The present invention provides a programmable modular circuit for testing and controlling a system-on-a-chip integrated circuit, and applications thereof. In an embodiment, the programmable modular circuit comprises a plurality of serial-to-parallel interface registers coupled together by a data line, a clock line, and an enable line. Each of the plurality of serial-to-parallel interface registers is coupled to a module of the system-on-a-chip. The data line and the clock line are used to serially clock data into the plurality of serial-to-parallel interface registers. Applying a first logical value to the enable line provides the data serially clocked into the plurality of serial-to-parallel interface registers to modules of the system-on-a-chip. Applying a second logical value to the enable line provides default values to modules of the system-on-a-chip. The data values serially clocked into the plurality of serial-to-parallel interface registers can be used to test and/or to modify selected operating characteristics of the system-on-a-chip.

Further embodiments, features, and advantages of the present invention, as well as the structure and operation of various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the present invention and to enable a person skilled in the pertinent art to make and use the present invention.

The present invention is described with reference to the accompanying drawings. The drawing in which an element first appears is typically indicated by the leftmost digit or digits in the corresponding reference number.

DETAILED DESCRIPTION OF THE INVENTION

The present invention provides a programmable modular circuit for testing and controlling a system-on-a-chip integrated circuit, and applications thereof. In the detailed description of the present invention that follows, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In an embodiment, a programmable modular circuit according to the present invention comprises a plurality of serial-to-parallel interface registers coupled together by a data line, a clock line, and an enable line. Each of the plurality of serial-to-parallel interface registers is coupled to a module of the system-on-a-chip. The data line and the clock line are used to serially clock data into the plurality of serial-to-parallel interface registers. Applying a first logical value to the enable line provides the data serially clocked into the plurality of serial-to-parallel interface registers to modules of the system-on-a-chip. Applying a second logical value to the enable line provides default values to modules of the system-on-a-chip. The data values serially clocked into the plurality of serial-to-parallel interface registers can be used to test and/or to modify selected operating characteristics of the system-on-a-chip.

Figure 1A:
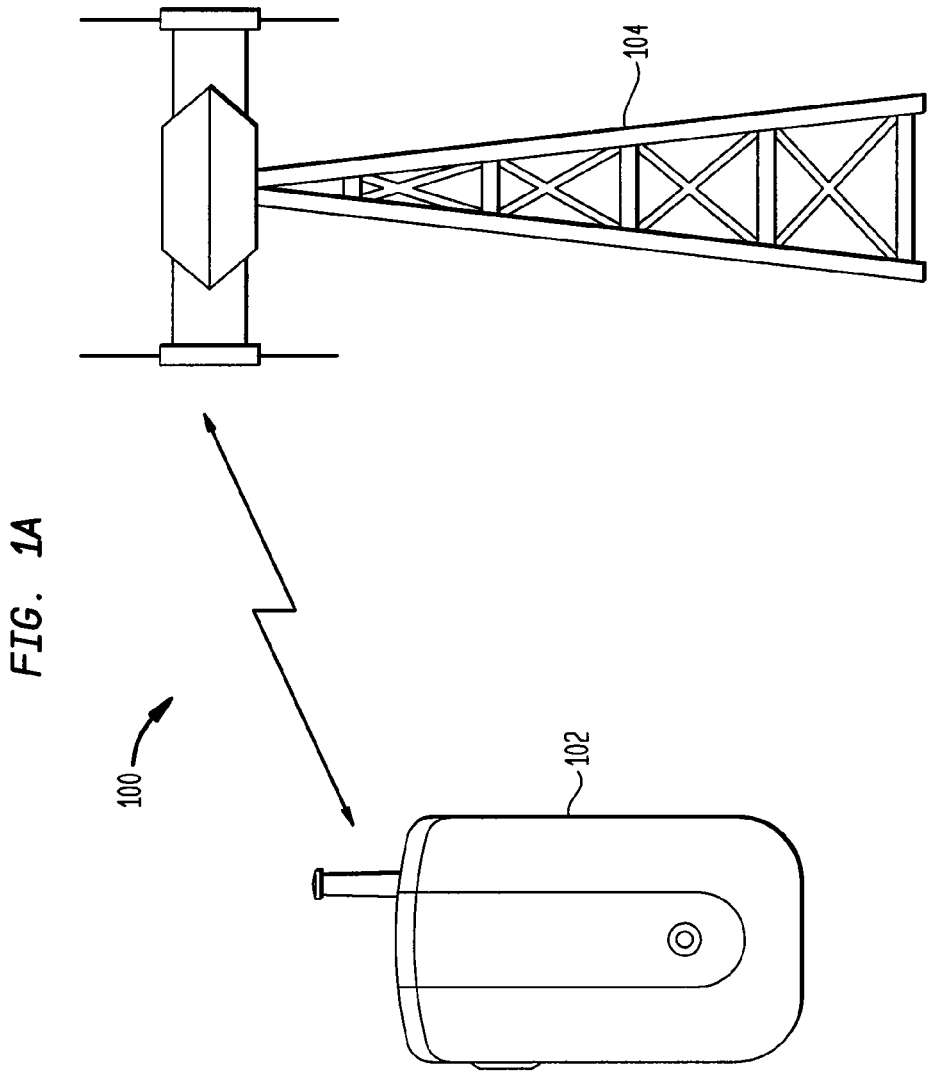
FIG. 1A is a diagram of an example electronic system in which a programmable modular circuit according to an embodiment of the present invention is employed.

FIG. 1A is a diagram of an example electronic system 100 in which a programmable modular circuit according to an embodiment of the present invention is employed. Electronic system 100 comprises a cellular telephone 102 in communication with a cellular communication tower 104. As would be know to persons skilled in the known relevant art(s), cellular telephone 102 includes a system-on-a-chip (SoC) integrated circuit such as SoC 106 shown in FIG. 1B. It is to be noted, however, that the present invention is not limited to being employed in cellular telephones.

Figure 1B:
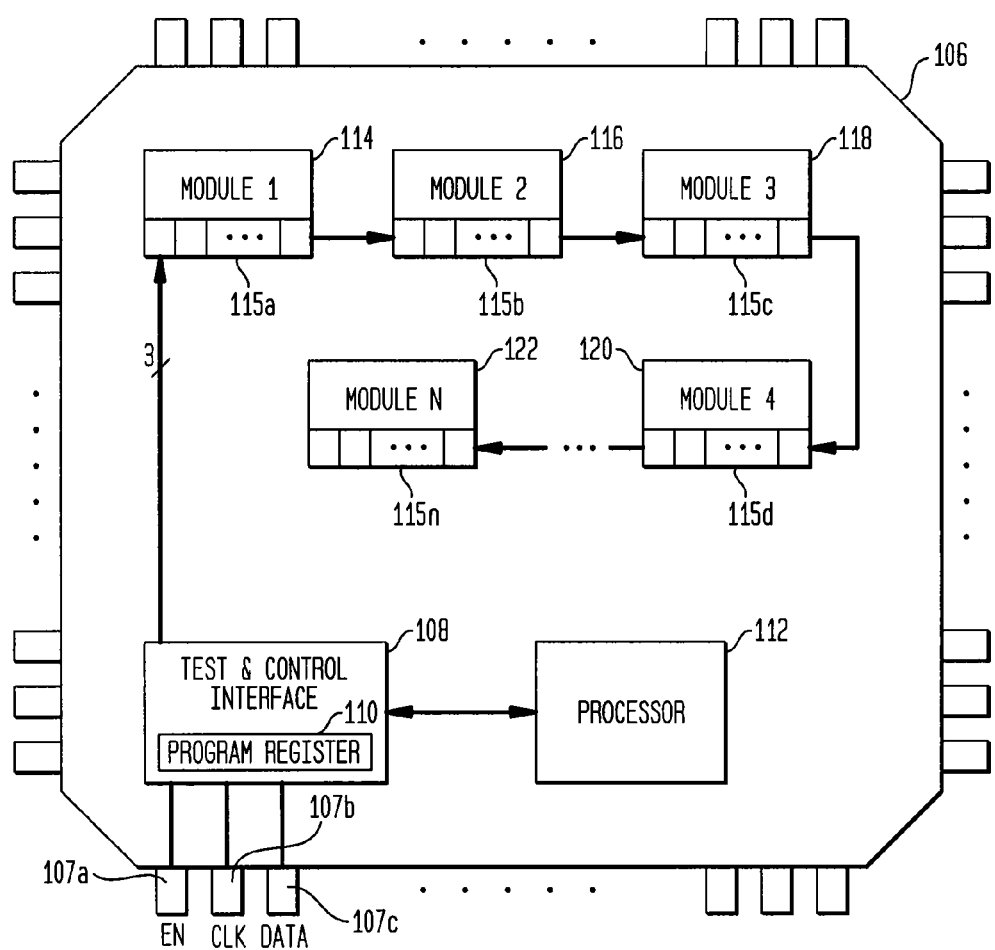
FIG. 1B is a diagram of an example system-on-a-chip integrated circuit in which a programmable modular circuit according to an embodiment of the present invention is employed.

FIG. 1B is a diagram of an example SoC 106 that includes a programmable modular circuit according to an embodiment of the present invention. As shown in FIG. 1B, SoC 106 includes a test and control interface module 108, a processor 112, and a plurality of sub-circuits or modules 114, 116, 118, 120, and 122. In an embodiment, modules 114, 116, 118, 120, and 122 are used to implement various functions of cellular telephone 102. Processor 112 can be any processor such as, for example, a MIPS processor available from MIPS Technology, Inc., 1225 Charleston Road, Mountain View, Calif. 94043-1353.

As shown in FIG. 1B, modules 114, 116, 118, 120, and 122 are coupled to a plurality of serial-to-parallel interface registers 115. Module 114 is coupled to serial-to-parallel interface register 115a. Module 116 is coupled to serial-to-parallel interface register 115b. Module 118 is coupled to serial-to-parallel interface register 115c. Module 120 is coupled to serial-to-parallel interface register 115d. Module 122 is coupled to serial-to-parallel interface register 115n. The serial-to-parallel interface register 115 are used to provide test and/or control values to the modules as described in more detail below. Note that an interface register 115 need not necessarily be provided for each module in SoC 106. Rather, the association of the interface register 115 with a corresponding module is an engineering decision that will depend on the specific application of the SoC.

In an embodiment, data is serially clocked into the plurality of serial-to-parallel interface registers using three pins 107a-c of SoC 106. Pin 107a is an enable (EN) pin. Pin 107b is a clock (CLK) pin. Pin 107c is a data pin. Data is serially clocked into the plurality of serial-to-parallel interface registers and provided to modules 114, 116, 118, 120, and 122 in an embodiment by applying signals to pins 107a-c in the manner illustrated by timing diagram 400 of FIG. 4.

In an embodiment, data stored in a program register 110 of test and control interface module 108 is serially clocked into the plurality of serial-to-parallel interface registers and provided to modules 114, 116, 118, 120, and 122. This is accomplished, for example, under the control of processor 112 as illustrated by FIG. 1C.

Figure 4:
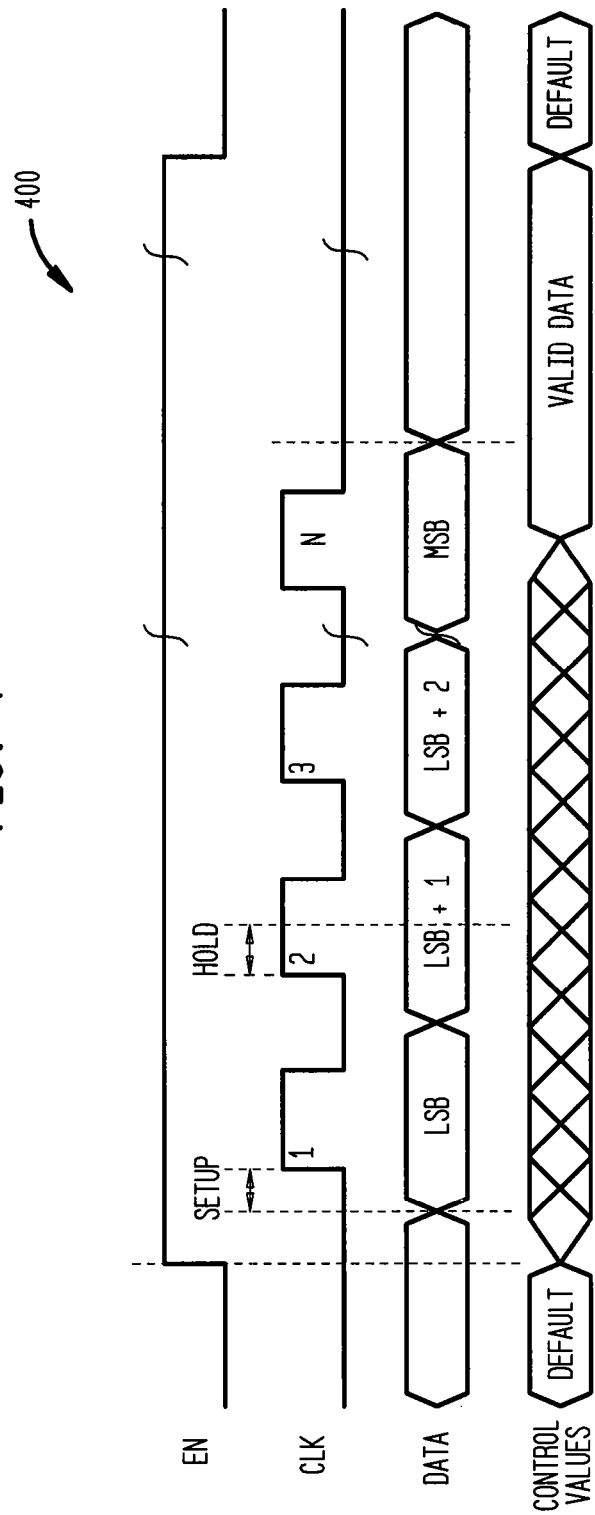
FIG. 4 is an example timing diagram for a programmable modular circuit according to an embodiment of the present invention.

In an alternative embodiment, data is provided in a plurality of program registers (not illustrated) and selectively provided to modules 114, 116, 118, 120, and 122 under processor control in the manner illustrated by timing diagram 400 of FIG. 4. The plurality of program registers may comprise a non-volatile memory that can contain data that is written to the program registers by an application program executed by processor 112. In this embodiment, data stored in the selected one of the program registers is selectively provided to modules 114, 116, 118, 120, and 122 in the manner described above with respect to program register 110 of test and control interface module 108. It will be noted that in this embodiment, there is no need to serially clock data into the interface registers using pins 107a-c of SoC 106 from an external source as this data is either provided by executing an application program or is permanently encoded in the program registers.

Figure 1C:
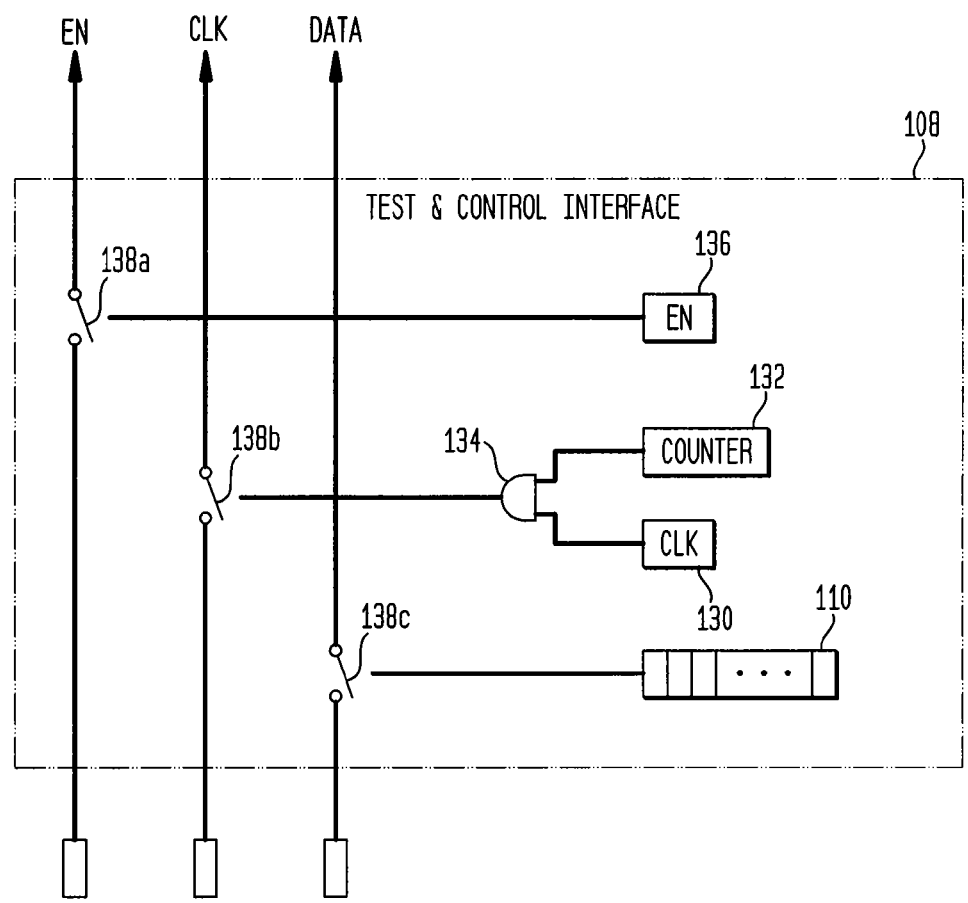
FIG. 1C is a diagram of an example test and control interface module according to an embodiment of the present invention.

FIG. 1C is a diagram of an example test and control interface module 108 according to an embodiment of the present invention. As shown in FIG. 1C, in an embodiment, test and control interface module 108 includes program register 110, a clock 130, a counter 132, an AND gate 134, an enable (EN) flag or control bit register 136, and three switches 138a-c. In an embodiment, the position of switches 138a-c is controlled by processor 112.

In one embodiment, test and control interface module 106 operates as follows. Processor 112 stores test or control values in program register 110. Processor 112 changes the enable control bit stored in register 136 from a logical low value to a logical high value. Processor 112 sets counter 132 to a value that will enable the test or control values stored in program register 110 to be serially clocked into the plurality of serial-to-parallel interface registers 115 by clock 130. When counter 132 counts down to zero, for example, AND gate 132 prevents the clock signal from being applied to the clock line.

As will be understood by persons skilled in the relevant art(s) given the description herein, processor 112 can be used to reprogram SoC 106. In one embodiment, SoC 106 is reprogrammed remotely, for example, by communicating with processor 112 using a wired or a wireless communication channel. In the example of electronic system 100, SoC 106 can be remotely reprogrammed, for example, using a back-channel of the cellular communication system.

In embodiments of the present invention, test and control interface module 108 operates strictly under the control of processor 112 (e.g., there are no pins 107a-c connected to test and control interface module 106 in this embodiment). In another embodiment, test and control interface module 106 operates only by applying signals to pins 107a-c (e.g., there is no means to control test and control interface 106 using processor 112).

Figure 2:
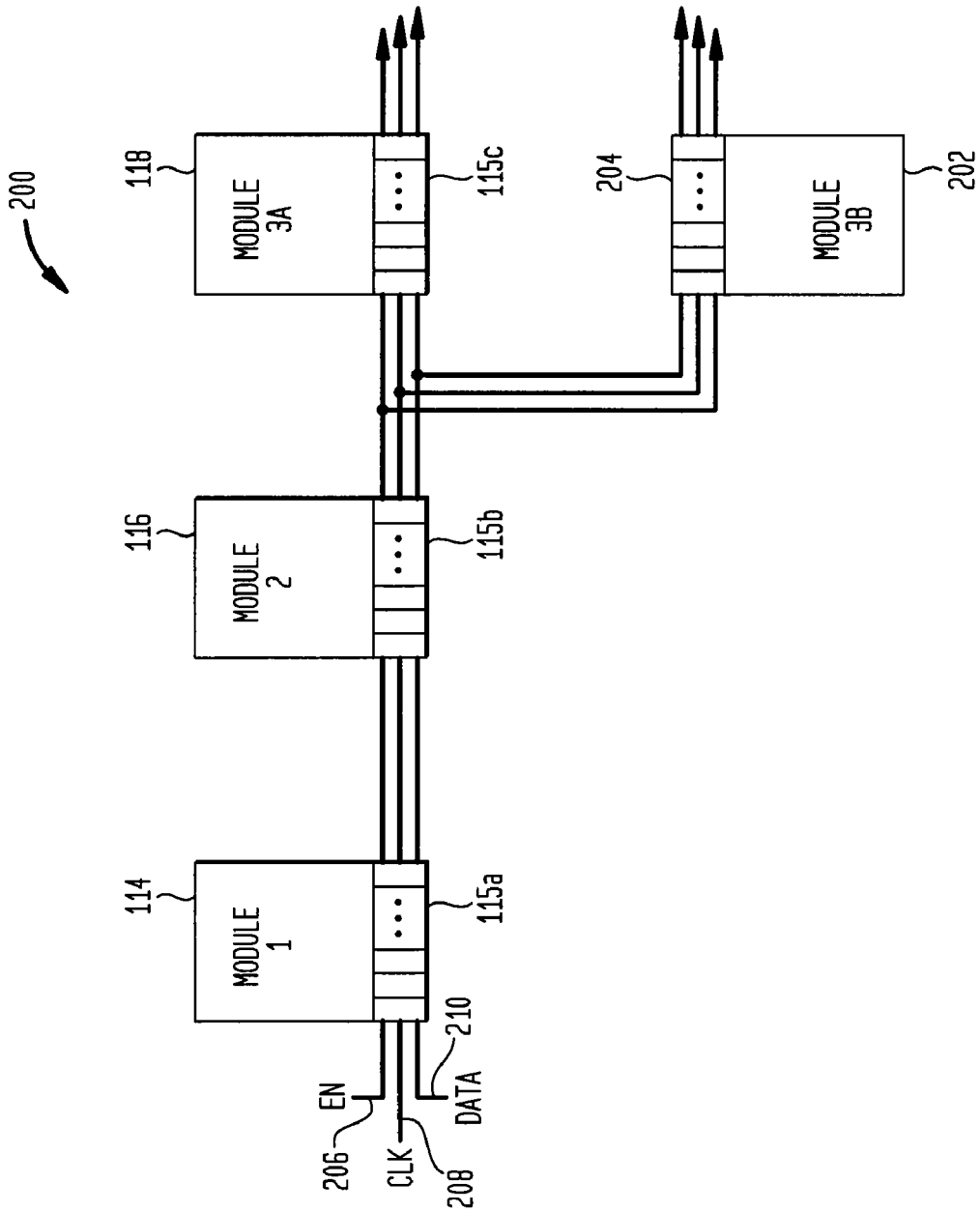
FIG. 2 is a diagram of an example programmable modular circuit according to an embodiment of the present invention.

FIG. 2 is a diagram of an example programmable modular circuit 200 according to an embodiment of the present invention. Programmable modular circuit 200 is similar to the programmable modular circuit shown in FIG. 1B except that programmable modular circuit 200 includes one or more serial-to-parallel interface registers 204 coupled in parallel with one or more serial-to-parallel interface registers 115.

As shown in FIG. 2, in an embodiment, programmable modular circuit 200 includes serial-to-parallel interface registers 115a-c and a serial-to-parallel interface register 202. Serial-to-parallel interface register 115a is coupled to module 114. Serial-to-parallel interface register 115b is coupled to module 116. Serial-to-parallel interface register 115c is coupled to module 118. Serial-to-parallel interface register 204 is coupled to a module 202. The serial-to-parallel interface register are coupled together by an enable (EN) line 206, a clock (CLK) line 208, and a data line 210. In an embodiment, test or control data is serially shifted into the serial-to-parallel interface registers 115a-c and 204 and provided to modules 114, 116, 118, and 202 by applying signals to lines 206, 208, and 210 in the manner illustrated by timing diagram 400 of FIG. 4. In an embodiment, the data serially shifted into serial-to-parallel interface register 204 is identical to the data serially shifted into serial-to-parallel interface register 115c.

Figure 3:
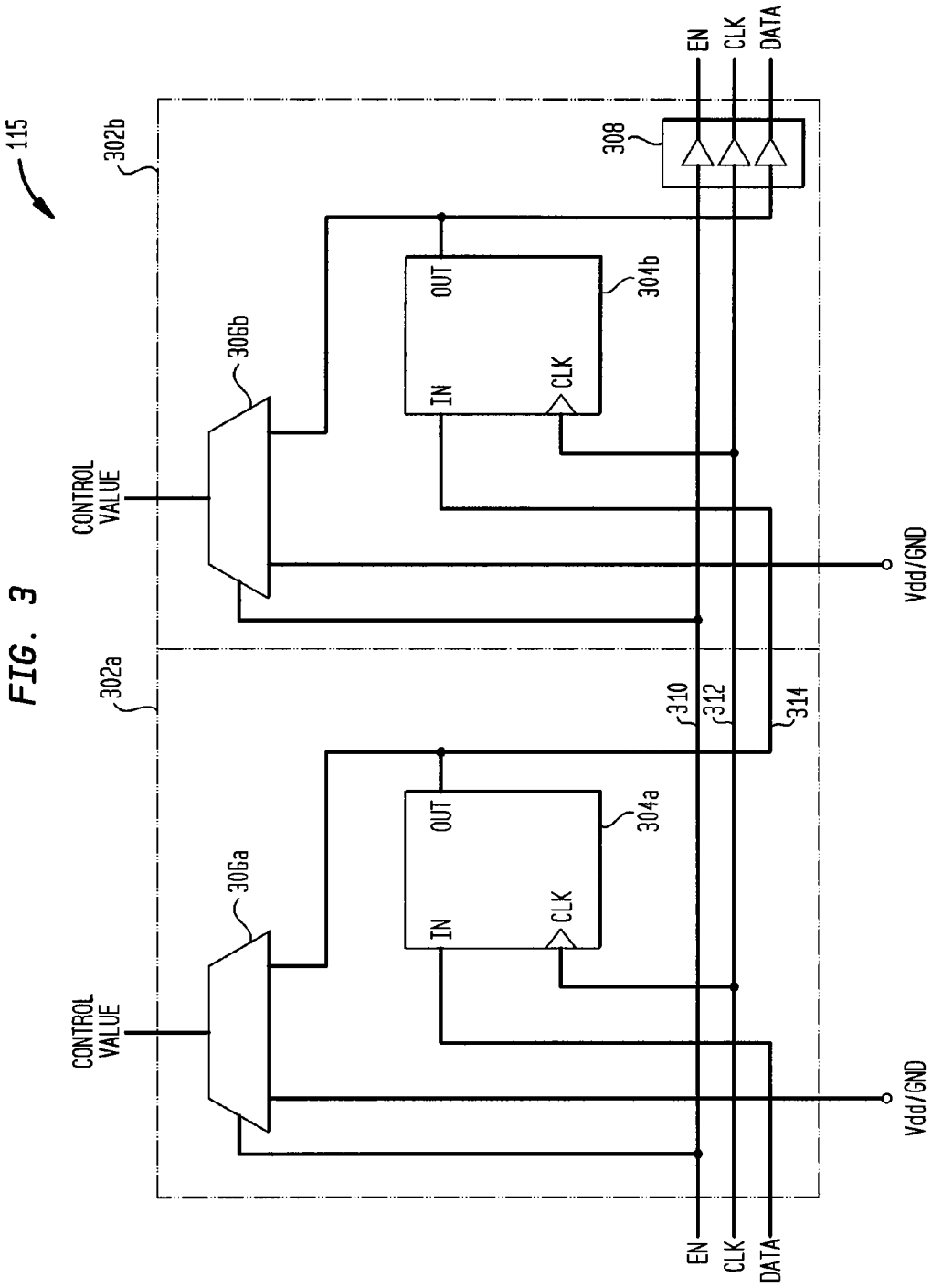
FIG. 3 is a diagram of an example serial-to-parallel interface register according to an embodiment of the present invention.

FIG. 3 is a more detailed diagram of an example serial-to-parallel interface register 115 according to an embodiment of the present invention. As shown in FIG. 3, the example serial-to-parallel interface register includes two control value cells 302a-b. In embodiments of the present invention, each serial-to-parallel interface register 115 includes at least one control value cell 302.

As shown in FIG. 3, control value cell 302a includes a flip-flop 304a and a multiplexer 306a. Flop-flop 304a includes an input port coupled to a data line 314, an output port coupled to data line 314, and a clock (CLK) port coupled to a clock line 312. Multiplexer 306a includes a first input port coupled to data line 314 and the output port of flip-flop 304a, a second input port coupled to a logical high value (e.g., Vdd) or a logical low value (e.g., ground (GND)), and a select port coupled to an enable (EN) line 310. The output of multiplexer 306a is a test or control value (or a default value) that is provided to a coupled module such as, for example, module 114 shown in FIG. 2. Control value cell 302a operates in a manner that will be understood by persons skilled in the relevant art(s) given the description herein.

Control value cell 302b includes a flip-flop 304b and a multiplexer 306b. Flop-flop 304b includes an input port coupled to data line 314, an output port coupled to data line 314, and a clock (CLK) port coupled to clock line 312. Multiplexer 306b includes a first input port coupled to the data line and the output port of flip-flop 304b, a second input port coupled to a logical high value (e.g., Vdd) or a logical low value (e.g., ground (GND)), and a select port coupled to enable line 310. The output of multiplexer 306b is a test or control value (or a default value) that is provided to a coupled module such as, for, example, module 114 shown in FIG. 3. Control value cell 302b also operates in a manner that will be understood by persons skilled in the relevant art(s) given the description herein.

As shown in FIG. 3, in an embodiment, a control value cell 302 can include an optional amplifier block 308 that is used to strengthen or buffer signals transmitted on enable line 310, clock line 312, and data line 314.

FIG. 4 is an example timing diagram 400 for a programmable modular circuit according to an embodiment of the present invention. As described herein, the signals depicted in timing diagram 400 can be used to operate a programmable modular circuit according to an embodiment of the present invention.

Figure 5:
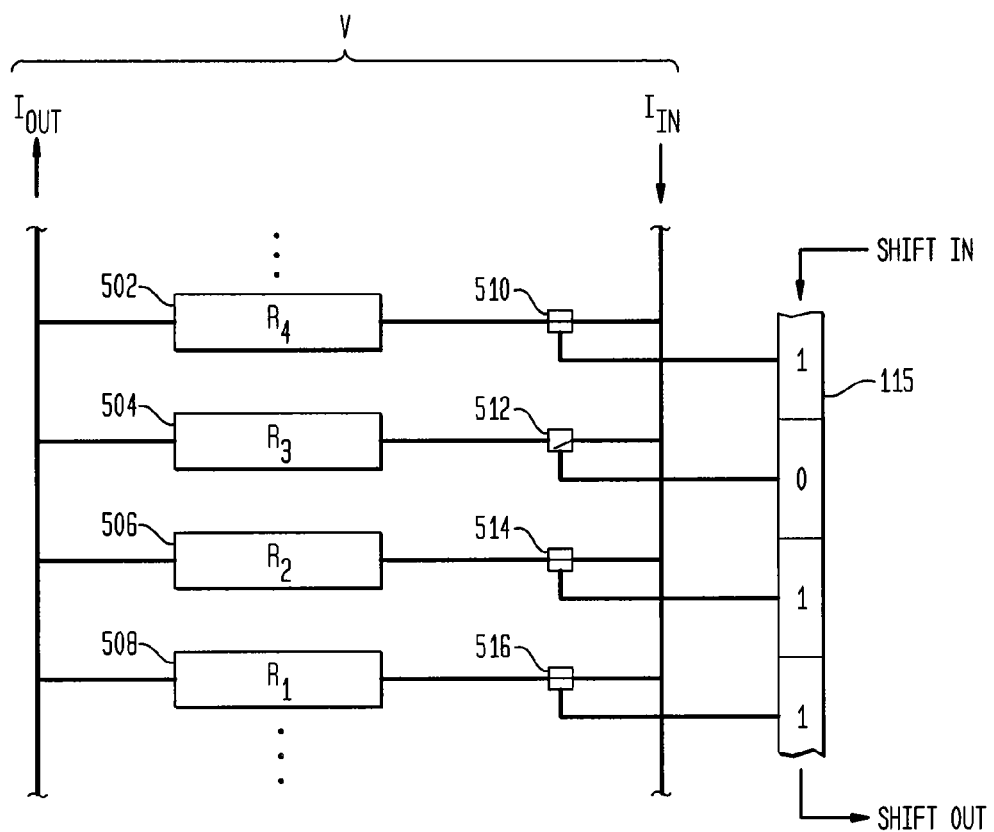
FIGS. 5-7 are diagrams that illustrates various example applications of a programmable modular circuit according to an embodiment of the present invention.
Figure 6:
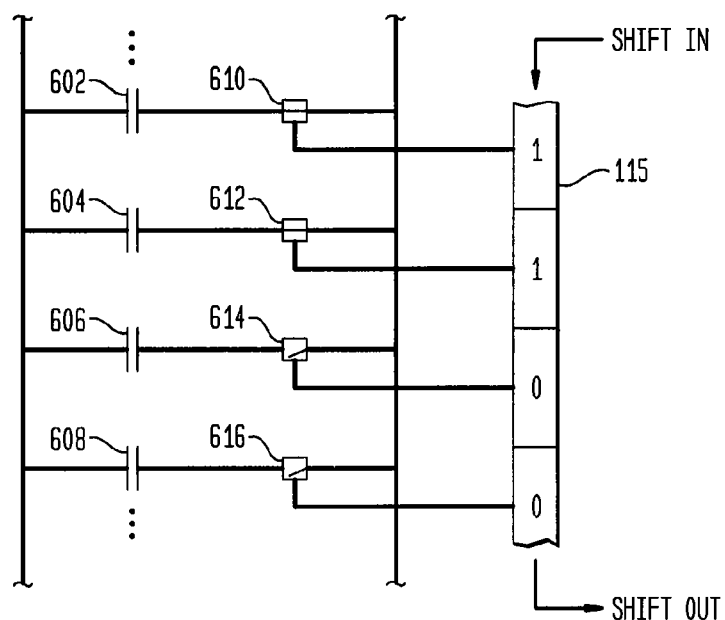
Figure 7:
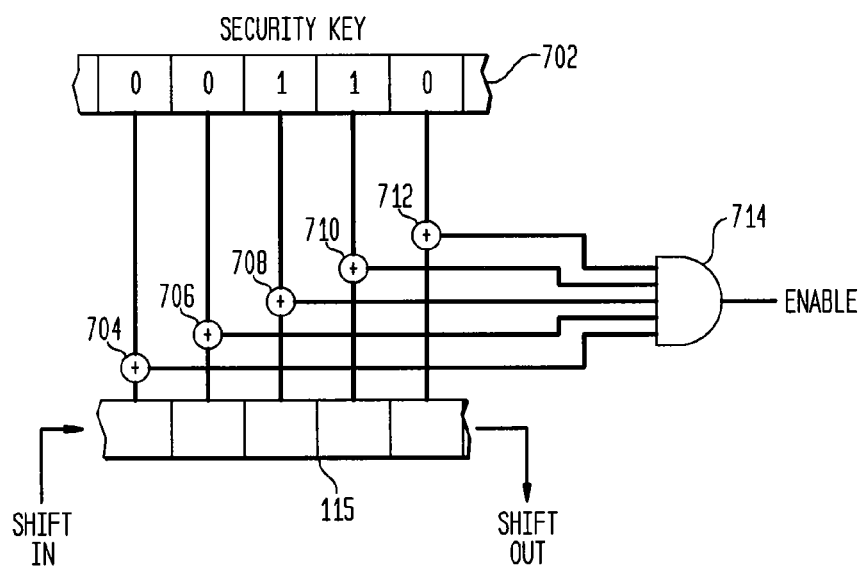

FIGS. 5-7 are diagrams that illustrates various example applications of a programmable modular circuit according to an embodiment of the present invention. For example, FIG. 5 illustrates using a programmable modular circuit according to an embodiment of the present invention to determine a resistance value. FIG. 6 illustrates using a programmable modular circuit according to an embodiment of the present invention to determine a capacitance value. FIG. 7 illustrates using a programmable modular circuit according to an embodiment of the present invention to input or provide a security key value. The example applications presented in FIGS. 5-7 are merely illustrative and not intended to limit the present invention in any way. Other applications of the present invention will become apparent to persons skilled in the relevant art(s) given the description herein.

As noted above, FIG. 5 illustrates using a programmable modular circuit according to an embodiment of the present invention to determine a resistance value. The resistance value is set by coupling control values serially clocked into a serial-to-parallel interface register 115 to a plurality of electronic switches 510, 512, 514, and 516. The control values operate the electronic switches to add or to remove resistors coupled, for example, in parallel and thereby vary an overall resistance of a circuit or sub-circuit. In other embodiments (not illustrated), the resisters are coupled in a series configuration and selectively added to or removed from the circuit.

In an embodiment, a logical high value (e.g., 1) closes a switch and thus switches an associated register into a circuit. This is illustrated by electronic switches 510, 514, and 516 and resistors 502, 506, and 508. A logical low value (e.g., 0) opens a switch and thus switches an associated register out of a circuit. This is illustrated by electronic switch 512 and resistor 504.

As will become apparent to persons skilled in the relevant art(s), the present invention can be used, for example, to reprogram a feedback resistance in an amplifier circuit and thus change the gain of the amplifier circuit. Similarly, the present invention can be used to tune a receiver circuit, adjust a filter circuit, etc by changing selected resistance values.

FIG. 6 illustrates using a programmable modular circuit according to an embodiment of the present invention to determine a capacitance value. The capacitance value is set by coupling control values serially clocked into a serial-to-parallel interface register 115 to a plurality of electronic switches 610, 612, 614, and 616. The control values operate the electronic switches to add or to remove capacitors coupled, for example, in parallel and thereby vary an overall capacitance.

In an embodiment, a logical high value (e.g., 1) closes a switch and thus switches an associated capacitor into a circuit. This is illustrated by electronic switches 610 and 614 and capacitors 602 and 604. A logical low value (e.g., 0) opens a switch and thus switches an associated capacitor out of a circuit. This is illustrated by electronic switches 614 and 616 and capacitors 606 and 608.

As will become apparent to persons skilled in the relevant art(s), the capacitance reprogramming feature of the present invention can be used to vary the operating characteristic of an SoC. In embodiments, this feature of the present invention is used in combination with the resistance varying feature described above with reference to FIG. 5.

In embodiments, the present invention is used to switch elements other than resistors and/or capacitors into and out of a circuit of an SoC.

FIG. 7 illustrates using a programmable modular circuit according to an embodiment of the present invention to input or provide a security key value. As shown in FIG. 7, comparators 704, 706, 708, 710, and 712 compare values shifted into a serial-to-parallel interface register 115 to a security key value stored in a security key register 702. If each of the compared values match, an AND gate 714 outputs an enable value. The enable value can be used for example to control selected features of an SoC such as, for example, audio features, video features, etc. In an embodiment, the values shifted into serial-to-parallel interface register can be received from a remote location via a wired or a wireless communication channel and used to activate and/or configure an electronic device such as, for example, cellular telephone 102. Additional applications for this feature of the present invention will become apparent to persons skilled in the relevant art(s) given the description herein.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware, implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as, for example, semiconductor, magnetic disk, and optical disk (e.g., CD-ROM, DVD-ROM, etc.).

It is understood that the apparatus and method embodiments described herein may be included in a semiconductor intellectual property core, (e.g., embodied in HDL) and transformed to hardware in the production of integrated circuits.

Additionally, the apparatus and method embodiments described herein may be embodied as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims. The summary and abstract sections may set forth one or more but not all exemplary embodiments of the present invention.

What is claimed is:

1. A circuit device, comprising:
    a plurality of modules, each module for performing a selected function; and
    a programmable test and control circuit comprising:
        a data line;
        a clock line;
        an enable line; and
        a plurality of serial-to-parallel interface registers coupled together by the data line, the clock line, and the enable line, wherein each of the plurality of serial-to-parallel interface registers comprises:
            a flip-flop having an input port coupled to the data line, an output port coupled to the data line, and a clock port coupled to the clock line; and
            a multiplexer having a first input port coupled to the output port of the flip-flop, a second input port coupled to a default value, and a select port coupled to the enable line,
        wherein each of the plurality of serial-to-parallel interface registers is coupled to a corresponding one of the plurality of modules, and
    wherein control or test data is serially shifted into the plurality of serial-to-parallel interface registers using the data line and the clock line, and the enable line is used to select whether the plurality of serial-to-parallel interface registers selectively provide either (1) the control or test data or (2) the default value to the plurality of modules.

2. The circuit device of claim 1, further comprising:
    an amplifier module coupled to the data line, the clock line and the enable line.

3. The circuit device of claim 1, wherein one of the plurality of serial-to-parallel interface registers is used to set resistive elements in order to determine a resistance value.

4. The circuit device of claim 1, wherein one of the plurality of serial-to-parallel interface registers is used to set capacitive elements in order to determine a capacitance value.

5. The circuit device of claim 1, wherein one of the plurality of serial-to-parallel interface registers is used to store a security key value.

6. A tangible computer readable storage medium comprising computer readable code which when executed by a computing device, causes the computing device to operate as a programmable test and control circuit, the programmable test and control circuit comprising:
    a data line;
    a clock line;
    an enable line; and
    a plurality of serial-to-parallel interface registers coupled together by the data line, the clock line, and the enable line, wherein each of the plurality of serial-to-parallel interface registers comprises:
        a flip-flop having an input port coupled to the data line, an output port coupled to the data line, and a clock port coupled to the clock line; and
        a multiplexer having a first input port coupled to the output port of the flip-flop, a second input port coupled to a default value, and a select port coupled to the enable line,
    wherein each of the plurality of serial-to-parallel interface registers is coupled to a module of a system-on-a-chip, and
    wherein control or test data is serially shifted into the plurality of serial-to-parallel interface registers using the data line and the clock line, and the enable line is used to select between (1) the control or test data and (2) the default value for output to the modules of the system-on-a-chip.

7. The tangible computer readable storage medium of claim 6, wherein the programmable test and control circuit further comprises:
    an amplifier module coupled to the data line, the clock line and the enable line.

8. The tangible computer readable storage medium of claim 6, wherein one of the plurality of serial-to-parallel interface registers is used to set resistive elements in order to determine a resistance value.

9. The tangible computer readable storage medium of claim 6, wherein one of the plurality of serial-to-parallel interface registers is used to set capacitive elements in order to determine a capacitance value.

10. The tangible computer readable storage medium of claim 6, wherein one of the plurality of serial-to-parallel interface registers is used to store a security key value.

11. The tangible computer readable storage medium of claim 6, wherein the programmable test and control circuit is embodied in hardware description language software.

12. The tangible computer readable storage medium of claim 6, wherein the programmable test and control circuit is embodied in one of Verilog hardware description language software and VHDL hardware description language software.

13. A method comprising:
    testing and controlling modules of a system-on-a-chip, wherein the system-on-a-chip comprises a plurality of serial-to-parallel interface registers coupled together by a data line, a clock line, and an enable line, each of the plurality of serial-to-parallel interface registers being coupled to a respective module of the system-on-a-chip, wherein each of the plurality of serial-to-parallel interface registers comprises:
        a flip-flop having an input port coupled to the data line, an output port coupled to the data line, and a clock port coupled to the clock line; and
        a multiplexer having a first input port coupled to the output port of the flip-flop, a second input port coupled to a default value, and a select port coupled to the enable line,
    wherein the testing and controlling include:
        serially clocking data into the plurality of serial-to-parallel interface registers with the data line and the clock line;
        applying a first logical value to the enable line to provide the data serially clocked into the plurality of serial-to-parallel interface registers to modules of the system-on-a-chip; and
        applying a second logical value to the enable line to provide default values to the modules of the system-on-a-chip.

14. The method of claim 13, wherein the data set elements in order to determine one of a resistance value and a capacitance value.

15. The method of claim 13, wherein the data include a security key.

16. The method of claim 13, wherein the data are used to test modules of the system-on-a-chip.

* * * * *